(12) United States Patent
Wu

(10) Patent No.: US 9,548,586 B2
(45) Date of Patent: Jan. 17, 2017

(54) ENERGY INTEGRATING DEVICE FOR SPLIT SEMICONDUCTOR LASER DIODES

(71) Applicant: Elite Optoelectronics Co., LTD, Xi'An, Shannxi (CN)

(72) Inventor: Yanlin Wu, Shannxi (CN)

(73) Assignees: Elite Optoelectronics Co., LTD, Xi'An, Shannxi (CN); Yanlin Wu, Xi'An, Shannxi (CN)

( * ) Notice: Subject to any disclaimer, the term of this patent is extended or adjusted under 35 U.S.C. 154(b) by 0 days.

(21) Appl. No.: 14/775,609

(22) PCT Filed: Sep. 19, 2014

(86) PCT No.: PCT/CN2014/086938
§ 371 (c)(1),
(2) Date: Sep. 11, 2015

(87) PCT Pub. No.: WO2016/019615
PCT Pub. Date: Feb. 11, 2016

(65) Prior Publication Data
US 2016/0204572 A1    Jul. 14, 2016

(30) Foreign Application Priority Data
Aug. 7, 2014   (CN) .......................... 2014 1 0387104

(51) Int. Cl.
| H01S 5/022 | (2006.01) |
| G02B 6/42 | (2006.01) |
| G02B 3/04 | (2006.01) |
| G02B 27/10 | (2006.01) |
| G02B 27/12 | (2006.01) |
| H01S 5/40 | (2006.01) |

(52) U.S. Cl.
CPC ............ *H01S 5/02256* (2013.01); *G02B 3/04* (2013.01); *G02B 6/42* (2013.01); *G02B 27/106* (2013.01); *G02B 27/123* (2013.01); *H01S 5/40* (2013.01); *H01S 5/4012* (2013.01)

(58) Field of Classification Search
CPC ....................................................... G02B 6/42
USPC ....................................................... 359/639
See application file for complete search history.

(56) References Cited

U.S. PATENT DOCUMENTS

| 6,282,028 B1 * | 8/2001 | Waibel ................ G01C 15/002 359/618 |
| 2015/0369570 A1 * | 12/2015 | Conemac .............. F41H 13/005 359/639 |

* cited by examiner

*Primary Examiner* — James Jones

(57) ABSTRACT

An energy integrating device for split semiconductor laser diodes includes: an installing holder, wherein the installing holder has a disc structure with a positioning hole at a center thereof, four module bases for mounting laser modules are symmetrically provided at one side of the disc structure, and the laser modules are embedded inside the module bases; a printed circuit board, connected to the laser modules through sleeves, is mounted at one side of the module bases, and a wire and a plug are mounted on the printed circuit board for connecting a power source; the laser modules are adjusted and positioned through fastening screws, and laser beams thereof are emitted through surface holes of the installing holder with the disc structure; the laser beams from the laser modules are focused onto one laser spot through a positive lens.

11 Claims, 4 Drawing Sheets

ENERGY INTEGRATING DEVICE FOR SPLIT SEMICONDUCTOR LASER DIODES

CROSS REFERENCE OF RELATED APPLICATION

This is a U.S. National Stage under 35 U.S.C. 371 of the International Application PCT/CN2014/086938, filed Sep. 19, 2014, which claims priority under 35 U.S.C. 119(a-d) to CN 201410387104.2, filed Aug. 7, 2014.

BACKGROUND OF THE PRESENT INVENTION

Field of Invention

The present invention relates to a technical field of photoelectricity, and more particularly to a four-beam laser pointer structure.

Description of Related Arts

Conventionally, laser medical and cosmetic technologies are rapidly developed. A small standard-packaged semiconductor laser diode has advantages of wide temperature scope, simple drive, high electric-optical conversion efficiency, different wavelengths, and good monochromatic, which replaces conventional large-scale gas or solid laser devices for medical and cosmetic industries. However, due to a low power, a single semiconductor laser diode is not suitable when high laser power is needed. Therefore, beams from various semiconductor laser diodes should be integrated.

Conventional integrating methods are divided into two categories. The first one forms an array with wafers of the semiconductor laser diodes, so as to form a palladium strip type laser device. The second one uses an optical fiber coupling system for coupling and integrating the beams from various semiconductor laser diodes.

The above two methods have disadvantages as follows:

1) the wafer array method need extreme-high precision lens array for beam integration, and the wafer array emits a large amount of heat; therefore, a little defect will affect the service life of the wafer, and cooling requirements are extremely high during operation;

2) the optical fiber coupling method is complex, while a beam integrating efficiency is low; optical fibers used for energy transmission are usually multimode fibers, which greatly destroys characteristics of a laser source, and is not suitable when certain beam modes are needed;

3) costs of both methods are high, wherein both the lens array and the optical fiber beam integration system, and adjusting structures thereof are expensive, which have no advantage in household physiotherapy industry which is growing popularity; and 4) processes are complex, which is almost impossible to mass production, and is only suitable for large-scale equipments of research institutions or professional medical organizations.

SUMMARY OF THE PRESENT INVENTION

An object of the present invention is to provide an energy integrating device for split semiconductor laser diodes, wherein a structure thereof is compact, design is artful and reasonable, and complexity of conventional laser integrating devices is greatly simplified, in such a manner that conventional market requirements for integrating devices for semiconductor laser diodes are satisfied.

Accordingly, the present invention provides:

an energy integrating device for split semiconductor laser diodes, comprising: an installing holder, wherein the installing holder has a disc structure with a positioning hole at a center thereof, four module bases for mounting laser modules are symmetrically provided at one side of the disc structure, and the laser modules are respectively embedded inside the module bases; a printed circuit board, connected to the laser modules through sleeves, is mounted at one side of the module bases, and a wire and a plug are mounted on the printed circuit board for connecting a power source; the laser modules are adjusted and positioned through fastening screws, and laser beams thereof are emitted through surface holes of the installing holder with the disc structure; the laser beams from the laser modules are focused onto one laser spot through a positive lens.

Preferably, installing holes for embedding the laser modules are provided inside the module bases; the laser modules with convex plates are embedded inside the installing holes of the module bases, and are positioned through an interval between the convex plates and the installing holes of the module bases, a distance between an external diameter of the convex plates and an internal diameter of the installing holes of the module bases is 0.5 mm.

Preferably, embedding slots for embedding the fastening screws are respectively provided along three directions of the installing holes of the module bases; an angle between center lines of adjacent embedding slots is 100°.

Preferably, the fastening screws are mounted at external surfaces at front portions of the convex plates of the laser modules.

Preferably, each of the laser modules comprises a semiconductor laser diode embedded in a laser diode holder, a lens barrel mounted at an external side of the semiconductor laser diode, and an aspheric lens mounted at a front end of an illuminant body of the semiconductor laser diode, which forms a laser basic unit.

Preferably, a low-power 808 nm semiconductor laser diode is a light source of each of the laser modules, the aspheric lens are mounted in front of the semiconductor laser diodes, in such a manner that the laser beams are shaped into far field alignment light and the laser spot at a distance of 50 m has a diameter of within 10 mm.

Preferably, the printed circuit board comprises a CN5611 constant current control chip, for inputting a voltage of 2.6-3.3V, and a current of 30-800 mA.

Preferably, the positive lens is an aspheric lens with a focal distance of 60 mm and a diameter of 27 mm; an optical effective aperture thereof is 20 mm, for focusing beams within a diameter of 20 mm with same axial directions onto a focus point at a distance of 60 mm.

Preferably, the installing holder is formed by machining an aluminum material.

Preferably, the embedding slots are filled with 703 silicone rubber.

According to the above structure, four independent semiconductor laser diode driving units drive four semiconductor laser diodes. The four independent semiconductor laser diodes are processed with linear alignment, then the four beams are adjusted to be parallel with a parallel coaxial adjusting structure, and finally the four beams are integrated through the aspheric lens, wherein a laser spot, whose energy is 4 times of a single independent semiconductor laser diode, is obtained at an optical focal point. In practice, by adjusting a lens position forwards and backwards, a laser spot position is precisely adjusted, for integrating the beams of various semiconductor laser diodes. The structure of the present invention is compact, design is artful and reasonable, and complexity of conventional laser integrating devices is greatly simplified, in such a manner that conventional market requirements for integrating devices for semiconductor laser diodes are satisfied.

Compared with the conventional technologies, the present invention has advantages as follows:

1) structure is compact, design is reasonable, installation is simple, operation is convenient;

2) the present invention processes standard semiconductor laser diodes with two optical precision adjustment, for integrating energy of various semiconductor laser diodes;

3) the present invention uses standard machining structures and aspheric lenses, instead of complex structures of conventional optical integration such as lens array, multi-mode optical fiber, optical fiber coupling alignment focusing lens, and coupling adjusting mechanism, so as to simplify processes; and 4) costs of the present invention are low, complexity of conventional optical energy integration methods are lowered, manufacturing processes are simple, a product service life is long, practicability is strong, and application is easy to be popular.

BRIEF DESCRIPTION OF THE DRAWINGS

Referring to drawings, the present invention is further illustrated. The present invention as shown in the drawings is exemplary only and not intended to be limiting.

Figure 1:
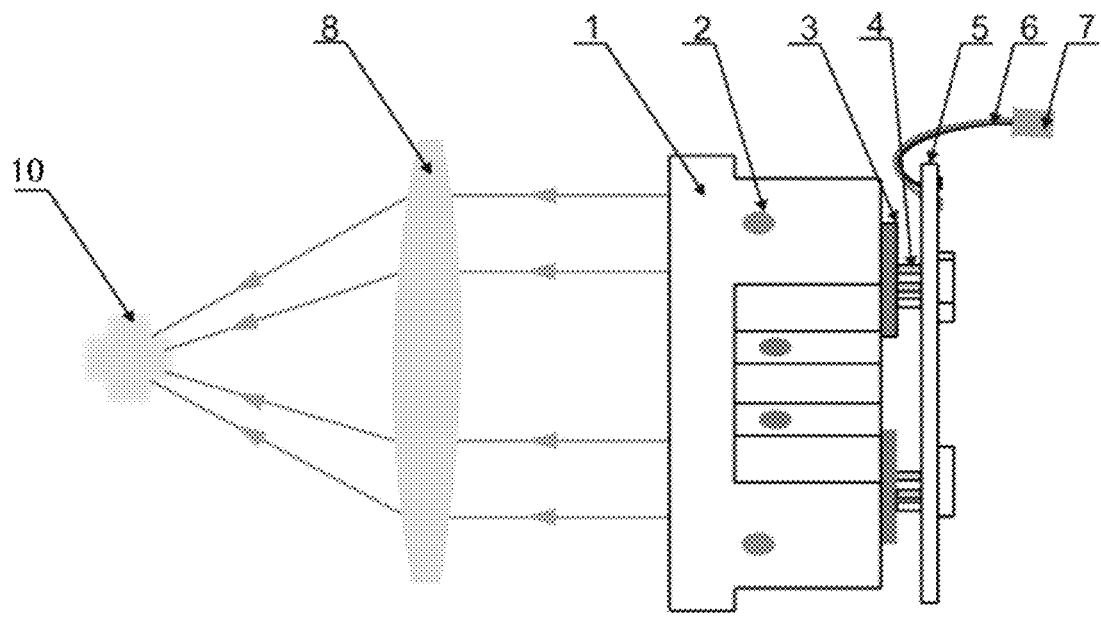
FIG. 1 is a sketch view of a lightening principle according to the present invention.

Element reference: 1—installing holder; 1-1—module base; 2—fastening screw; 3—laser modules; 3-1—convex plate; 4—sleeve; 5—printed circuit board; 5-1—power adjusting potential device; 5-2—constant current control chip; 5-3—LD pin; 6—wire; 7—plug; 8—positive lens; 9—laser spots before being focused and integrated by a positive lens.

DETAILED DESCRIPTION OF THE PREFERRED EMBODIMENT

Referring to drawings and a preferred embodiment, the present invention is further illustrated. The present invention as shown in the drawings and described above is exemplary only and not intended to be limiting.

Figure 2:
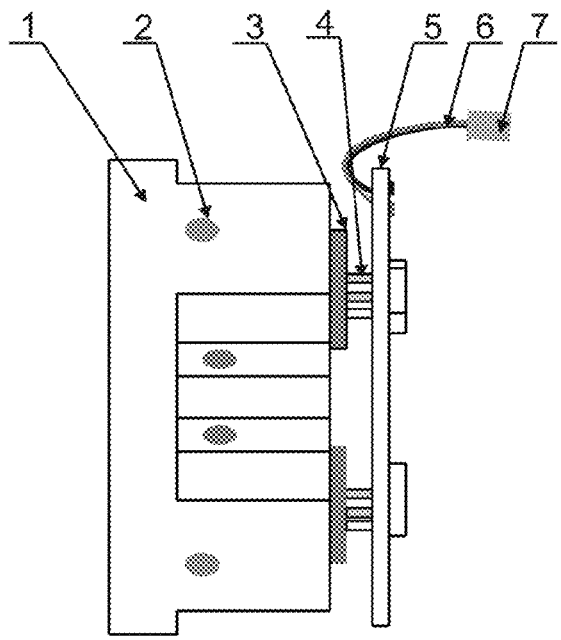
FIG. 2 is a sketch view of an energy integrating device for four laser beams.
Figure 3:
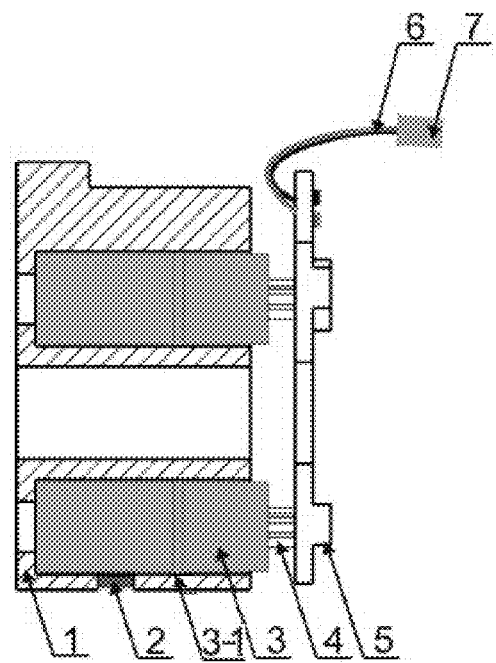
FIG. 3 is a sketch view of installation of the energy integrating device for four laser beams.
Figure 4:
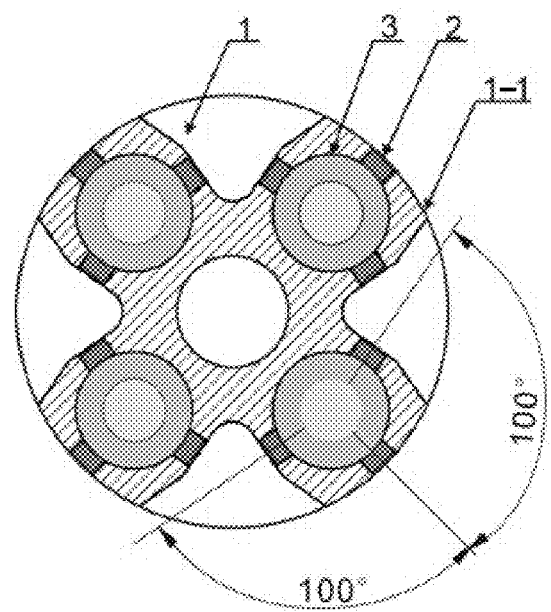
FIG. 4 is a sketch view of modules.

Referring to FIGS. 1, 2 and 3, an energy integrating device for split semiconductor laser diodes comprises: an installing holder 1, wherein referring to FIG. 4, the installing holder 1 has a disc structure with a positioning hole at a center thereof, four module bases 1-1 for mounting laser modules 3 are symmetrically provided at one side of the disc structure, each of the module bases has a front opening, the laser modules 3 are respectively embedded inside the module bases 1-1 and laser beams thereof are emitted through surface holes of the installing holder 1 with the disc structure; the laser modules 3 are respectively embedded inside the module bases 1-1 and positioned through fastening screws 2, in such a manner that the laser beams from the laser modules 3 are focused onto one laser spot through a positive lens 8. The positive lens 8 is an aspheric lens with a focal distance of 60 mm and a diameter of 27 mm; an optical effective aperture thereof is 20 mm, for focusing beams within a diameter of 20 mm with same axial directions onto a focus point at a distance of 60 mm.

A printed circuit board 5 connected through sleeves 4 is mounted at one side of the installing holder 1, and a wire 6 and a plug 7 are mounted on the printed circuit board 5 for connecting a power source; installing holes for embedding the laser modules 3 are respectively provided inside the module bases 1-1; the laser modules 3 with convex plates 3-1 are respectively embedded inside the installing holes of the module bases 1-1, and are positioned through an interval between the convex plates 3-1 and the installing holes of the module bases 1-1, a distance between an external diameter of the convex plates 3-1 and an internal diameter of the installing holes of the module bases 1-1 is 0.5 mm. The fastening screws 2 are mounted at external surfaces at front portions of the convex plates 3-1 of the laser modules 3.

According to the preferred embodiment, a Φ7.5*0.5 convex plate is provided on a Φ7 laser module, and the Φ7 laser module in mounted into a Φ7.5 installing hole and is positioned with convex plate interval, so as to adjust an angle to 3.5°. Then adjustment is provided within a range that a diameter of the installing hole is 0.5 mm larger than an external diameter of the laser module.

Referring to FIG. 4, embedding slots for the fastening screws 2 are respectively provided at an external side, a left side and a right side of each of the module bases 1-1, and an angle between center lines of adjacent embedding slots is 100°.

Figure 5:
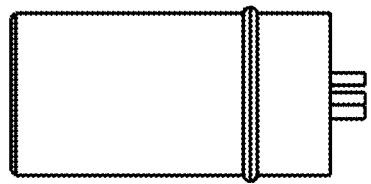
FIG. 5 is a sketch view of a laser module.

Referring to FIG. 5, each of the laser modules 3 comprises a semiconductor laser diode embedded in a laser diode holder, a lens barrel mounted at an external side of the semiconductor laser diode, and an aspheric lens mounted at a front end of an illuminant body of the semiconductor laser diode, which forms a laser basic unit; wherein there are four identical laser modules. A low-power 808 nm semiconductor laser diode is a light source of each of the laser modules 3, the aspheric lens are mounted in front of the semiconductor laser diodes, in such a manner that the laser beams are shaped into far field alignment light and the laser spot at a distance of 50 m has a diameter of within 10 mm.

Figure 6:
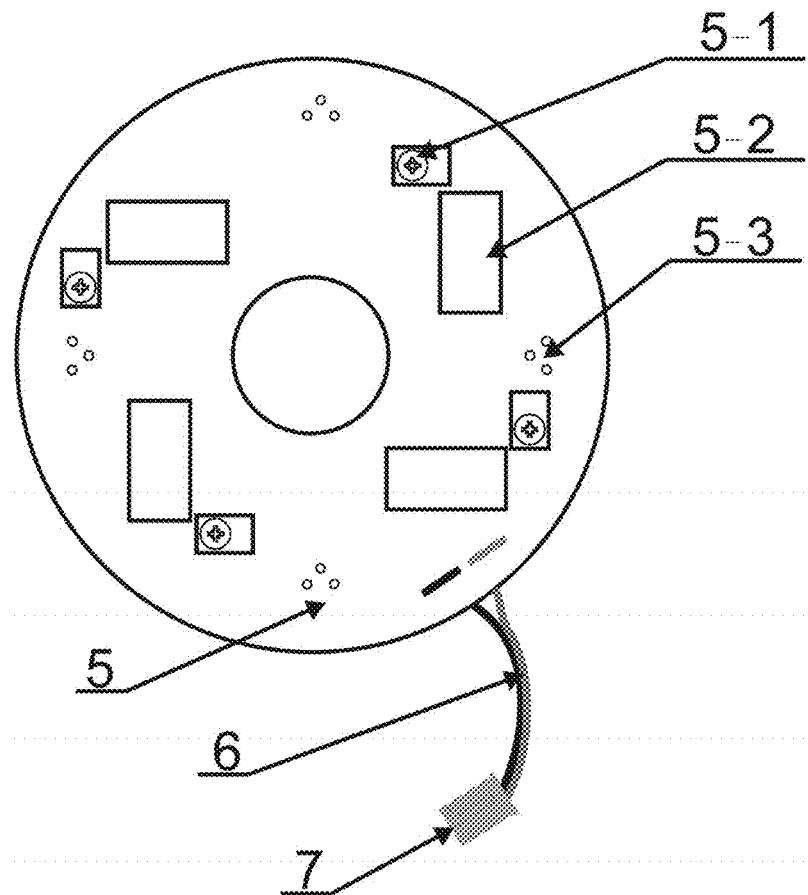
FIG. 6 is a schematic view of a printed circuit board of four laser pointers.

Referring to FIG. 6, the printed circuit board 5 comprises four symmetrically distributed CN5611 constant current control chips 5-2, for inputting a voltage of 2.6-3.3V, and a current of 30-800 mA. A power adjusting potential device 5-1 is provided at each of the CN5611 constant current control chips 5-2, and four LD pins 5-3 are provided on the printed circuit board 5. The printed circuit board 5 uses two sleeves 4 for welding diode pins thereon. The plug 7 is welded on the printed circuit board 5 through a 26AWG red-black wire. The installing holder 1 is formed by machining an aluminum material.

Figure 7:
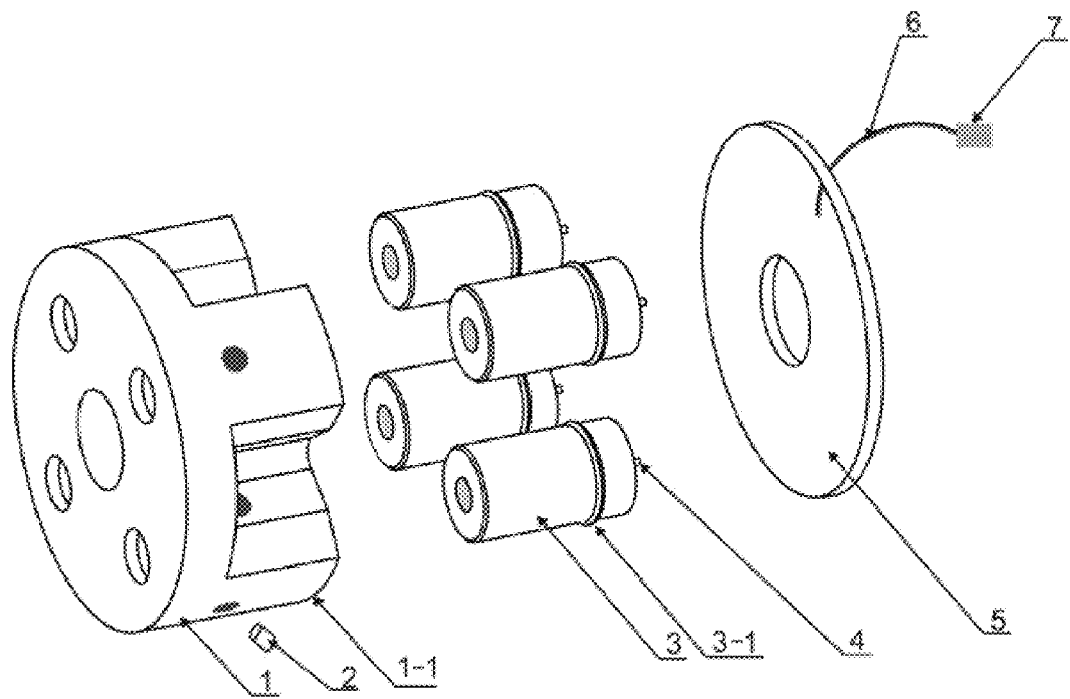
FIG. 7 is an exploded view of the four laser pointers.

Referring to FIG. 7, a perspective view of installation of the present invention is illustrated, wherein the four identical laser modules 3 are embedded in the module bases 1-1 of the installing holder 1, and are respectively adjusted from three directions through the three fastening screws 2; the module bases 1-1 where the laser modules 3 are embedded have four corresponding openings, the four openings are corresponding to the four surface holes in front of the laser modules 3.

Figure 8:
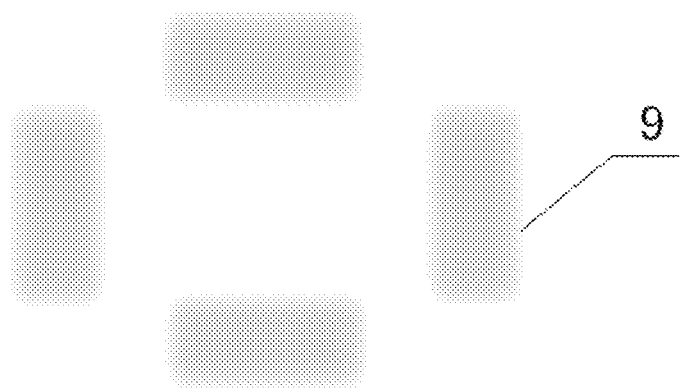
FIG. 8 is a sketch view of 808 nm laser spots before being focused and integrated by a positive lens.

Referring to FIG. 8, after being powered, a sketch view of 808 nm laser spots before being focused and integrated by a positive lens is illustrated, wherein the laser spots before being focused and integrated by the positive lens are marked as 9.

During operation, the laser modules 3 are respectively embedded inside the module bases 1-1 of the installing holder 1. The printed circuit board 5 and the plug 7 are switched on in sequence. On the printed circuit 5, the four modules are respectively welded with the diodes through the two sleeves 4. A plug base is connected to the 26AWG red-black wire welded on the printed circuit board 5. With help of auxiliary laser modules, the four aligned laser modules 3 are adjusted from the three directions (with angles therebetween of 100°) by the three M2*2 fastening screws 2. The convex plates 3-1 on the laser modules 3 contact with internal surfaces of the module bases 1-1, for adjusting an angle to 3.5°. Three angles are able to be finely adjusted by the fastening screws 2, in such a manner that the laser beams from the laser modules 3 are adjusted to parallel beams and are focused by the positive lens 8 at a focus point at a distance of 60 mm. The laser spots are adjusted to be even, and then the embedding slots are locked and filled with 703 silicone rubber. Finally, the energy integrating device for four laser beams focuses the four even laser beams onto the laser spot at a far distance through the positive lens 8.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An energy integrating device for split semiconductor laser diodes, comprising: an installing holder (1), wherein the installing holder (1) has a disc structure with a positioning hole at a center thereof, four module bases (1-1) for mounting laser modules (3) are symmetrically provided at one side of the disc structure, and the laser modules (3) are respectively embedded inside the module bases (1-1); a printed circuit board (5), connected to the laser modules (3) through sleeves (4), is mounted at one side of the module bases (1-1), and a wire (6) and a plug (7) are mounted on the printed circuit board (5) for connecting a power source; the laser modules (3) are adjusted and positioned through fastening screws (2), and laser beams thereof are emitted through surface holes of the installing holder (1) with the disc structure; the laser beams from the laser modules (3) are focused onto one laser spot through a positive lens (8).

2. The energy integrating device, as recited in claim 1, wherein installing holes for embedding the laser modules (3) are provided inside the module bases (1-1); the laser modules (3) with convex plates (3-1) are embedded inside the installing holes of the module bases (1-1), and are positioned through an interval between the convex plates (3-1) and the installing holes of the module bases (1-1), a distance between an external diameter of the convex plates (3-1) and an internal diameter of the installing holes of the module bases (1-1) is 0.5 mm.

3. The energy integrating device, as recited in claim 2, wherein embedding slots for embedding the fastening screws (2) are respectively provided along three directions of the installing holes of the module bases (1-1); an angle between center lines of adjacent embedding slots is 100°.

4. The energy integrating device, as recited in claim 2, wherein the fastening screws (2) are mounted at external surfaces at front portions of the convex plates (3-1) of the laser modules (3).

5. The energy integrating device, as recited in claim 3, wherein the fastening screws (2) are mounted at external surfaces at front portions of the convex plates (3-1) of the laser modules (3).

6. The energy integrating device, as recited in claim 1, wherein each of the laser modules (3) comprises a semiconductor laser diode embedded in a laser diode holder, a lens barrel mounted at an external side of the semiconductor laser diode, and an aspheric lens mounted at a front end of an illuminant body of the semiconductor laser diode, which forms a laser basic unit.

7. The energy integrating device, as recited in claim 6, wherein a low-power 808 nm semiconductor laser diode is a light source of each of the laser modules (3), the aspheric lens are mounted in front of the semiconductor laser diodes, in such a manner that the laser beams are shaped into far field alignment light and the laser spot at a distance of 50 m has a diameter of within 10 mm.

8. The energy integrating device, as recited in claim 1, wherein the printed circuit board (5) comprises a CN5611 constant current control chip (5-2), for inputting a voltage of 2.6-3.3V, and a current of 30-800 mA.

9. The energy integrating device, as recited in claim 1, wherein the positive lens (8) is an aspheric lens with a focal distance of 60 mm and a diameter of 27 mm; an optical effective aperture thereof is 20 mm, for focusing beams within a diameter of 20 mm with same axial directions onto a focus point at a distance of 60 mm.

10. The energy integrating device, as recited in claim 1, wherein the installing holder (1) is formed by machining an aluminum material.

11. The energy integrating device, as recited in claim 3, wherein the embedding slots are filled with 703 silicone rubber.

* * * * *